(12) United States Patent
Koshi et al.

(10) Patent No.: US 9,970,112 B2
(45) Date of Patent: May 15, 2018

(54) SUBSTRATE PROCESSING APPARATUS AND METHOD OF MANUFACTURING SEMICONDUCTOR DEVICE

(71) Applicant: Hitachi Kokusai Electric Inc., Tokyo (JP)

(72) Inventors: Yasunobu Koshi, Toyama (JP); Kenichi Suzaki, Toyama (JP); Akihito Yoshino, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 324 days.

(21) Appl. No.: 14/636,712

(22) Filed: Mar. 3, 2015

(65) Prior Publication Data

US 2015/0176130 A1 Jun. 25, 2015

Related U.S. Application Data

(62) Division of application No. 13/727,193, filed on Dec. 26, 2012, now Pat. No. 8,999,858.

(30) Foreign Application Priority Data

Dec. 27, 2011 (JP) .................................. 2011-285391

(51) Int. Cl.
*C23C 16/52* (2006.01)
*H01L 21/02* (2006.01)
(Continued)

(52) U.S. Cl.
CPC .............. *C23C 16/52* (2013.01); *C23C 16/24* (2013.01); *C23C 16/4405* (2013.01);
(Continued)

(58) Field of Classification Search
CPC ....... C23C 16/52; C23C 16/455; C23C 16/24; C23C 16/4405; C23C 16/4412;
(Continued)

(56) References Cited

U.S. PATENT DOCUMENTS 4,666,556 A * 5/1987 Fulton ................... H01L 21/743
148/DIG. 50
4,716,852 A * 1/1988 Tsujii .................... C23C 16/483
118/715
(Continued)

FOREIGN PATENT DOCUMENTS

JP 1995297127 A 11/1995
JP 11-243059 9/1999
(Continued)

OTHER PUBLICATIONS

Office Action in corresponding Japanese Patent Application No. 2012-285311, dated Oct. 28, 2016, with English translation.
(Continued)

*Primary Examiner* — Rudy Zervigon
(74) *Attorney, Agent, or Firm* — Edell, Shapiro & Finnan LLC

(57) ABSTRACT

The substrate processing apparatus includes a reaction chamber configured to accommodate a substrate; a first gas supply unit configured to supply a first process gas containing a silicon element to the substrate; a second gas supply unit configured to supply a second process gas containing a silicon element and a chlorine element to the substrate; an exhaust unit configured to exhaust the first process gas and the second process gas; a cleaning gas bypass supply unit configured to supply a cleaning gas to the exhaust unit; a cleaning monitoring unit installed in the exhaust unit; a gas flow rate control unit configured to adjust an amount of the cleaning gas supplied; and a main control unit configured to control the gas flow rate control unit in response to a signal received from the cleaning gas monitoring unit.

10 Claims, 6 Drawing Sheets

(51) Int. Cl.
*C23C 16/24* (2006.01)
*C23C 16/44* (2006.01)
*C23C 16/455* (2006.01)
*H01L 21/67* (2006.01)

(52) U.S. Cl.
CPC ........ *C23C 16/4412* (2013.01); *C23C 16/455* (2013.01); *H01L 21/02057* (2013.01); *H01L 21/02104* (2013.01); *H01L 21/67028* (2013.01); *H01L 21/67248* (2013.01)

(58) Field of Classification Search
CPC ......... H01L 21/67248; H01L 21/67028; H01L 21/02057; H01L 21/02104
See application file for complete search history.

(56) References Cited

U.S. PATENT DOCUMENTS

| | | | | |
|---|---|---|---|---|
| 4,717,596 A * | 1/1988 | Barbee | ................ | C23C 16/4485 118/50 |
| 4,992,301 A * | 2/1991 | Shishiguchi | ............ | C30B 25/12 118/724 |
| 5,091,207 A * | 2/1992 | Tanaka | .................... | C23C 16/52 118/50 |
| 5,137,701 A * | 8/1992 | Mundt | .................... | B01D 53/00 204/157.3 |
| 5,200,388 A * | 4/1993 | Abe | .................... | C23C 16/408 427/255.32 |
| 5,401,316 A * | 3/1995 | Shiraishi | ............. | C23C 16/4412 118/689 |
| 5,427,625 A * | 6/1995 | Okase | ................. | C23C 16/4401 134/18 |
| 5,496,408 A * | 3/1996 | Motoda | ............... | C23C 16/4481 118/715 |
| 5,554,226 A * | 9/1996 | Okase | ................. | C23C 16/4401 118/715 |
| 5,637,153 A | 6/1997 | Niino et al. | | |
| 5,648,282 A * | 7/1997 | Yoneda | ............. | H01L 21/02238 257/E21.284 |
| 5,858,065 A * | 1/1999 | Li | ........................ | B01D 53/22 95/230 |
| 5,925,188 A * | 7/1999 | Oh | ......................... | C23C 16/24 118/715 |
| 5,928,426 A * | 7/1999 | Aitchison | ............ | B01D 53/005 118/715 |
| 6,007,330 A * | 12/1999 | Gauthier | ................. | C23C 16/52 427/248.1 |
| 6,074,486 A * | 6/2000 | Yang | .................. | C23C 16/0272 118/715 |
| 6,132,515 A * | 10/2000 | Gauthier | ............. | C23C 16/4481 118/715 |
| 6,143,080 A * | 11/2000 | Bartholomew | ..... | C23C 16/4412 118/715 |
| 6,187,072 B1 * | 2/2001 | Cheung | ................. | B01D 45/06 118/715 |
| 6,217,633 B1 * | 4/2001 | Ohmi | ....................... | B01J 3/00 95/127 |
| 6,383,300 B1 * | 5/2002 | Saito | .................... | C23C 16/345 118/715 |
| 6,454,860 B2 * | 9/2002 | Metzner | .................. | C23C 16/407 118/715 |
| 6,525,882 B1 * | 2/2003 | Yamamoto | ............... | G02B 5/08 359/507 |
| 6,527,884 B1 * | 3/2003 | Takakuwa | ............... | C21D 1/76 148/634 |
| 6,579,372 B2 * | 6/2003 | Park | .................. | C23C 16/45544 118/715 |
| 6,592,817 B1 * | 7/2003 | Tsai | .................... | C23C 16/4412 422/505 |
| 6,599,845 B2 * | 7/2003 | Sato | ........................ | C01B 13/00 257/E21.285 |
| 6,605,134 B2 * | 8/2003 | Ishihara | ................ | B01D 53/22 95/45 |
| 6,673,323 B1 * | 1/2004 | Bhatnagar | ............... | B01D 53/34 423/210 |
| 6,773,687 B1 * | 8/2004 | Hasegawa | ............... | B01D 53/68 423/210 |
| 6,782,907 B2 * | 8/2004 | Kawasaki | ........... | C23C 16/4412 118/715 |
| 6,787,481 B2 * | 9/2004 | Asai | ...................... | C23C 16/405 257/E21.274 |
| 6,796,316 B2 * | 9/2004 | Park | .................... | C23C 16/4405 134/2 |
| 6,807,971 B2 * | 10/2004 | Saito | ..................... | C23C 16/345 134/1 |
| 6,869,892 B1 * | 3/2005 | Suzuki | .................... | C23C 8/10 257/E21.285 |
| 6,946,304 B2 * | 9/2005 | Shimizu | ............... | C23C 16/4405 118/715 |
| 7,011,710 B2 * | 3/2006 | Bang | ...................... | C23C 16/401 118/715 |
| 7,022,298 B2 * | 4/2006 | Hasegawa | ............... | B01D 53/68 423/210 |
| 7,102,104 B2 * | 9/2006 | Saito | ................. | H01L 21/67109 118/50.1 |
| 7,253,107 B2 * | 8/2007 | Snijders | ............... | C23C 16/4412 257/E21.17 |
| 7,296,532 B2 * | 11/2007 | Cheng | .................. | C23C 16/4412 118/723 MP |
| 7,419,550 B2 * | 9/2008 | Suzuki | ............... | H01L 21/02238 118/715 |
| 7,422,635 B2 * | 9/2008 | Zheng | ................ | C23C 16/45546 118/715 |
| 7,622,007 B2 * | 11/2009 | Nakaiso | ............... | C23C 16/455 118/715 |
| 7,666,479 B2 * | 2/2010 | Strang | ............... | C23C 16/45523 118/663 |
| 7,682,843 B2 * | 3/2010 | Moriya | ................. | C23C 16/455 118/690 |
| 7,871,938 B2 * | 1/2011 | Ozaki | .................. | H01L 21/0223 118/719 |
| 8,026,159 B2 * | 9/2011 | Horii | ...................... | C23C 16/409 118/723 VE |
| 8,039,049 B2 * | 10/2011 | Lee | ................... | H01L 21/02063 118/715 |
| 8,097,179 B2 * | 1/2012 | Williams | ............... | B01D 53/38 216/58 |
| 8,147,786 B2 * | 4/2012 | Tsuda | ................. | C23C 16/4412 118/715 |
| 8,176,871 B2 * | 5/2012 | Okuda | .................. | C23C 16/45538 118/663 |
| 8,235,001 B2 * | 8/2012 | Sano | .................... | C23C 16/4408 118/695 |
| 8,251,012 B2 * | 8/2012 | Ishimaru | ............... | C23C 16/509 118/723 E |
| 8,261,692 B2 * | 9/2012 | Kontani | ................ | C23C 16/452 118/723 E |
| 8,277,560 B2 * | 10/2012 | Sakai | .................. | C23C 16/4405 118/715 |
| 8,304,328 B2 * | 11/2012 | Maeda | .................. | C23C 16/345 257/E21.09 |
| 8,367,566 B2 * | 2/2013 | Sano | .................... | C23C 16/4408 118/695 |
| 8,415,237 B2 * | 4/2013 | Horii | ...................... | C23C 16/409 118/723 VE |
| 8,431,494 B2 * | 4/2013 | Murakami | ........ | C23C 16/45523 257/E21.274 |
| 8,453,600 B2 * | 6/2013 | Miyashita | ............ | C23C 16/345 118/723 E |
| 8,454,728 B2 * | 6/2013 | Grant | .................. | C23C 16/4412 118/715 |
| 8,461,062 B2 * | 6/2013 | Sakai | .................... | C23C 16/405 118/696 |
| 8,685,866 B2 * | 4/2014 | Horii | ...................... | C23C 16/40 257/E21.295 |
| 8,791,031 B2 * | 7/2014 | Yoshida | ................ | C23C 16/4408 118/715 |
| 8,828,141 B2 * | 9/2014 | Sakai | .................... | C23C 16/405 118/696 |

(56) References Cited

U.S. PATENT DOCUMENTS

| | | | |
|---|---|---|---|
| 8,999,858 B2* | 4/2015 | Koshi | H01L 21/02057 438/758 |
| 9,044,707 B2* | 6/2015 | Radoiu | B01D 53/007 |
| 9,150,965 B2* | 10/2015 | Moriya | C23C 16/4402 |
| 9,340,879 B2* | 5/2016 | Yahata | C23C 16/4405 |
| 9,735,007 B2* | 8/2017 | Kitamura | H01L 21/02568 |
| 2001/0035127 A1* | 11/2001 | Metzner | C23C 16/407 118/715 |
| 2001/0050054 A1* | 12/2001 | Kwag | C23C 16/4412 118/715 |
| 2002/0007790 A1* | 1/2002 | Park | C23C 16/4405 118/715 |
| 2002/0192369 A1* | 12/2002 | Morimoto | C23C 16/14 427/248.1 |
| 2002/0192370 A1* | 12/2002 | Metzner | C23C 16/407 427/248.1 |
| 2003/0094136 A1 | 5/2003 | Bartholomew et al. | |
| 2003/0124873 A1* | 7/2003 | Xing | C23C 16/402 438/770 |
| 2003/0181060 A1* | 9/2003 | Asai | C23C 16/405 438/758 |
| 2004/0007724 A1* | 1/2004 | Murthy | H01L 29/41733 257/288 |
| 2004/0118342 A1* | 6/2004 | Cheng | C23C 16/4412 118/715 |
| 2005/0045102 A1* | 3/2005 | Zheng | C23C 16/45546 118/722 |
| 2005/0087299 A1* | 4/2005 | Okabe | C23C 16/345 156/345.26 |
| 2005/0121432 A1* | 6/2005 | Saito | H01L 21/67109 219/390 |
| 2005/0145333 A1* | 7/2005 | Kannan | C23C 16/4412 156/345.24 |
| 2005/0189074 A1* | 9/2005 | Kasai | H01L 21/67253 156/345.33 |
| 2005/0249876 A1* | 11/2005 | Kawahara | C23C 16/45514 427/255.34 |
| 2005/0272269 A1* | 12/2005 | Suzuki | C23C 8/12 438/773 |
| 2005/0287806 A1* | 12/2005 | Matsuura | C23C 16/36 438/680 |
| 2006/0029735 A1* | 2/2006 | Ko | H01L 21/0223 427/248.1 |
| 2006/0081182 A1 | 4/2006 | Okada et al. | |
| 2007/0148075 A1* | 6/2007 | Popken | C01B 33/027 423/349 |
| 2007/0157882 A1* | 7/2007 | Ozaki | H01L 21/0223 118/715 |
| 2007/0234953 A1 | 10/2007 | Kaushal et al. | |
| 2008/0081130 A1* | 4/2008 | Farnia | C23C 16/30 427/577 |
| 2008/0145533 A1* | 6/2008 | Honda | C23C 16/405 427/248.1 |
| 2008/0171142 A1* | 7/2008 | Matsumoto | C23C 16/40 427/126.3 |
| 2008/0216742 A1* | 9/2008 | Takebayashi | C23C 16/45546 118/715 |
| 2008/0264337 A1* | 10/2008 | Sano | C23C 16/4408 118/704 |
| 2008/0305014 A1* | 12/2008 | Honda | G05D 7/0641 422/111 |
| 2009/0061541 A1* | 3/2009 | Moriya | C23C 16/455 438/10 |
| 2009/0061648 A1* | 3/2009 | Horii | C23C 16/409 438/778 |
| 2009/0064931 A1* | 3/2009 | Horii | C23C 16/0281 118/708 |
| 2009/0117752 A1 | 5/2009 | Ozaki et al. | |
| 2009/0238972 A1* | 9/2009 | Clark | C23C 16/24 427/255.28 |
| 2010/0055927 A1* | 3/2010 | Hirose | C23C 16/345 438/791 |
| 2010/0058984 A1* | 3/2010 | Marubayashi | C23C 16/24 118/715 |
| 2010/0081094 A1* | 4/2010 | Hasebe | C23C 16/02 430/323 |
| 2010/0112822 A1 | 5/2010 | Toratani et al. | |
| 2010/0240194 A1 | 9/2010 | Jung et al. | |
| 2011/0008955 A1* | 1/2011 | Horii | C23C 16/40 438/608 |
| 2011/0183519 A1* | 7/2011 | Kaga | C23C 16/34 438/680 |
| 2011/0186984 A1* | 8/2011 | Saito | H01L 21/02186 257/734 |
| 2011/0226418 A1* | 9/2011 | Ishibashi | C23C 16/4405 156/345.27 |
| 2011/0230057 A1* | 9/2011 | Takasawa | C23C 16/36 438/763 |
| 2011/0300695 A1* | 12/2011 | Horii | C23C 16/409 438/507 |
| 2011/0312192 A1* | 12/2011 | Murakami | C23C 16/401 438/787 |
| 2012/0160172 A1* | 6/2012 | Wamura | C23C 16/4402 118/726 |
| 2012/0240858 A1* | 9/2012 | Taniyama | H01L 21/67017 118/726 |
| 2013/0139690 A1* | 6/2013 | Ohuchi | B01D 53/02 96/4 |
| 2014/0045278 A1* | 2/2014 | Yoshida | C23C 16/4408 438/5 |
| 2015/0096494 A1* | 4/2015 | Nishiura | C23C 16/4405 118/697 |
| 2015/0125591 A1* | 5/2015 | Hsieh | C23C 16/4402 427/8 |
| 2015/0176130 A1* | 6/2015 | Koshi | H01L 21/02057 118/712 |
| 2015/0368794 A1* | 12/2015 | Morita | C23C 16/22 156/345.24 |
| 2016/0086801 A1* | 3/2016 | Kitamura | H01L 21/02568 438/478 |
| 2017/0081764 A1* | 3/2017 | Aburatani | C23C 16/4408 |

FOREIGN PATENT DOCUMENTS

| | | |
|---|---|---|
| JP | 2000-164517 | 6/2000 |
| JP | 2001-284264 A | 10/2001 |
| JP | 2004-289098 A | 10/2004 |
| JP | 2006-004962 | 1/2006 |
| JP | 2009-260377 | 11/2009 |
| JP | 2010-109245 A | 5/2010 |
| JP | 2010171389 | 8/2010 |
| WO | 2006049225 A1 | 5/2006 |

OTHER PUBLICATIONS

Office Action in Corresponding Korean Application No. 10-2012-0151771, dated Jan. 20, 2014, along with an English Translation.

* cited by examiner

US 9,970,112 B2

SUBSTRATE PROCESSING APPARATUS AND METHOD OF MANUFACTURING SEMICONDUCTOR DEVICE

CROSS REFERENCE TO RELATED APPLICATIONS

This application is a divisional of U.S. patent application Ser. No. 13/727,193 filed Dec. 26, 2012, entitled "Substrate Processing Apparatus and Method of Manufacturing Semiconductor Device," which claims foreign priority under 35 U.S.C. § 119(a)-(d) to Japanese Application No. 2011-285391 filed on Dec. 27, 2011, the entire contents of which are hereby incorporated by reference.

FIELD OF THE INVENTION

The present invention relates to a semiconductor manufacturing method including a substrate processing process, and a substrate processing apparatus.

BACKGROUND

Maintenance of a substrate processing apparatus for manufacturing a semiconductor device, such as a large-scale integrated circuit (IC), is periodically performed to maintain the cleanliness therein. Conventionally, a gas cleaning technique of introducing a cleaning gas into a reaction chamber has been used to remove a film deposited on an element of the reaction chamber.

However, since the conventional gas cleaning technique is aimed at removing a film adsorbed into a reaction chamber, a non-reactive gas may be adsorbed onto or by-products may remain in piping of an exhaust system even after gas cleaning is completed. When a non-reactive gas is adsorbed into or by-products remain in the piping of the exhaust system, a vacuum exhaust apparatus may be unexpectedly stopped or an apparatus maintenance process may be difficult to perform.

SUMMARY

It is an object of the present invention to provide a gas cleaning method of easily performing maintenance on an apparatus and a substrate processing apparatus including a gas cleaning system.

According to one aspect of the present invention, there is provided a substrate processing apparatus including: a reaction chamber configured to accommodate a substrate; a first gas supply unit configured to supply a first process gas containing a silicon element to the substrate; a second gas supply unit configured to supply a second process gas containing a silicon element and a chlorine element to the substrate; an exhaust unit configured to exhaust the first process gas and the second process gas; a cleaning gas bypass supply unit configured to supply a cleaning gas to the exhaust unit; a cleaning monitoring unit installed in the exhaust unit; a gas flow rate control unit configured to adjust an amount of the cleaning gas supplied; and a main control unit configured to control the gas flow rate control unit in response to a signal received from the cleaning gas monitoring unit.

According to another aspect of the present invention, there is provided a method of manufacturing a semiconductor device, including: a film formation process including supplying a first process gas containing a silicon element to a substrate and supplying a second process gas containing a silicon element and a chlorine element to the substrate; and a cleaning process including supplying a cleaning gas to an exhaust unit via a cleaning gas bypass line, monitoring the exhaust unit, and controlling a flow rate of the cleaning gas in response to a signal received from a cleaning monitoring unit.

According to still another aspect of the present invention, there is provided a non-transitory computer-readable recording medium that stores a program that causes a computer to perform: a film formation sequence including supplying a first process gas containing a silicon element to a substrate and supplying a second process gas containing a silicon element and a chlorine element to the substrate; and a cleaning sequence including supplying a cleaning gas to an exhaust unit via a cleaning gas bypass line, monitoring the exhaust unit, and controlling a flow rate of the cleaning gas in response to a signal received from a cleaning monitoring unit.

DETAILED DESCRIPTION

An Embodiment of the Present Invention

Hereinafter, an embodiment of the present invention will be described.

(1) Configuration of Substrate Processing Apparatus

Figure 1:
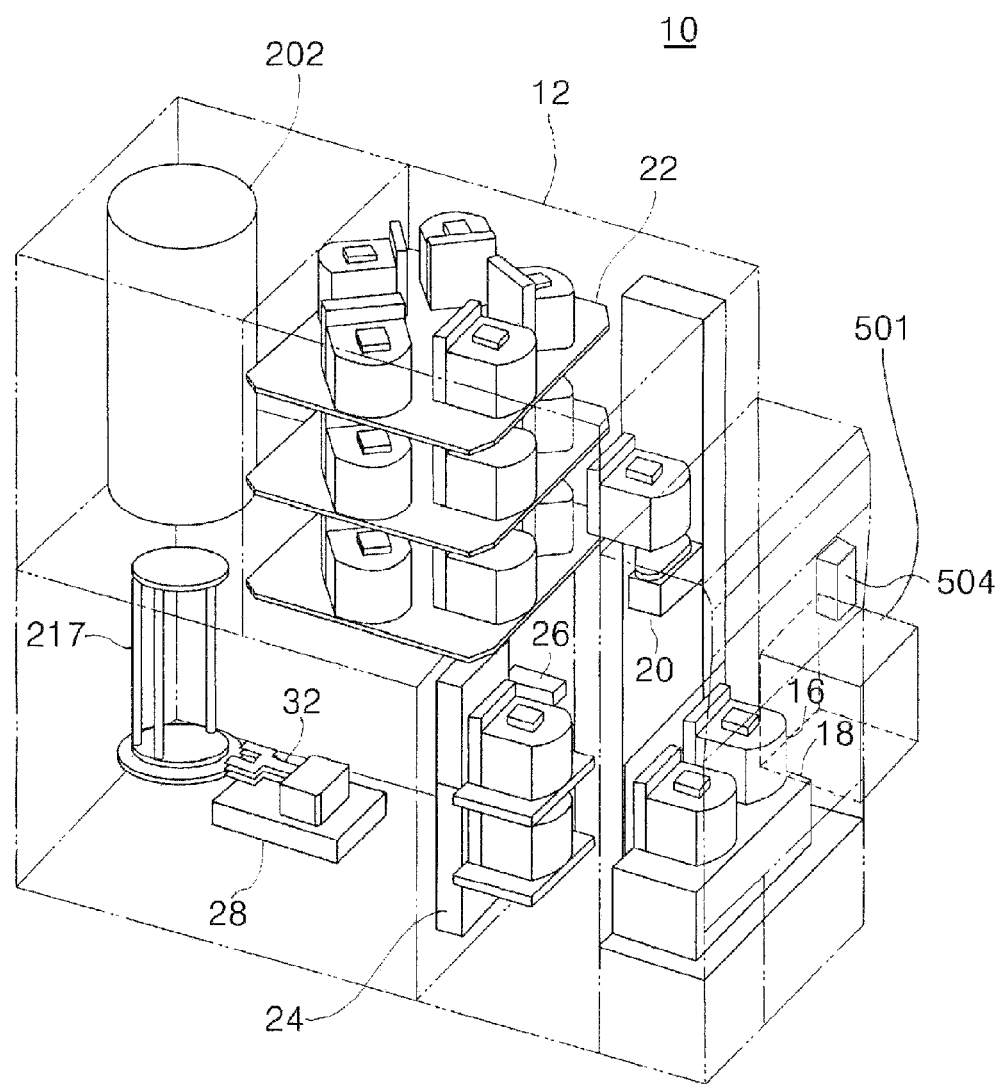
FIG. 1 is a configuration diagram of a substrate processing apparatus according to an embodiment of the present invention.

First, a configuration of a substrate processing apparatus that performs a method of manufacturing a semiconductor device according to an embodiment of the present invention will be described with reference to FIG. 1. FIG. 1 is a perspective view of a semiconductor manufacturing apparatus 10 serving as a substrate processing apparatus according to a first embodiment of the present invention. The semiconductor manufacturing apparatus 10 is a batch-type vertical thermal treatment apparatus, and includes a housing 12 in which main elements are disposed. In the semiconductor manufacturing apparatus 10, a front opening unified pod (FOUP) 16 (hereinafter referred to as 'pod') serving as a substrate accommodating device configured to accommodate a wafer 200, which is a substrate formed of, for example, silicon (Si) or silicon carbide (SiC), is used as a wafer carrier. A pod stage 18 is disposed in front of the housing 12. The pod 16 is transferred onto the pod stage 18.

For example, twenty-five wafers 200 are accommodated in the pod 16, and the pod 16 closed with a cover is placed on the pod stage 18.

A pod conveyance apparatus 20 is disposed in front of the housing 12 to face the pod stage 18. Pod shelves 22, a pod opener 24, and a substrate number detector 26 are disposed adjacent to the pod conveyance apparatus 20. The pod shelves 22 are disposed above the pod opener 24, and are configured to retain a plurality of pods 16 placed thereon. The substrate number detector 26 is disposed adjacent to the pod opener 24. The pod conveyance apparatus 20 conveys the pods 16 among the pod stage 18, the pod shelves 22, and the pod opener 24. The pod opener 24 is configured to open the cover of the pod 16, and the substrate number detector 26 is configured to detect the number of wafers 200 in the pod 16, the cover of which is open.

In the housing 12, a substrate transfer device 28 and a boat 217 which is a substrate holding mechanism are disposed. The substrate transfer device 28 includes an arm (tweezers) 32, and has a structure that can be moved upward/downward and rotated by a driving unit (not shown). The arm 32 may extract, for example, five wafers 200. By moving the arm 32, the wafers 200 may be conveyed between the pod 16 placed at a position of the pod opener 24 and the boat 217.

Figure 2:
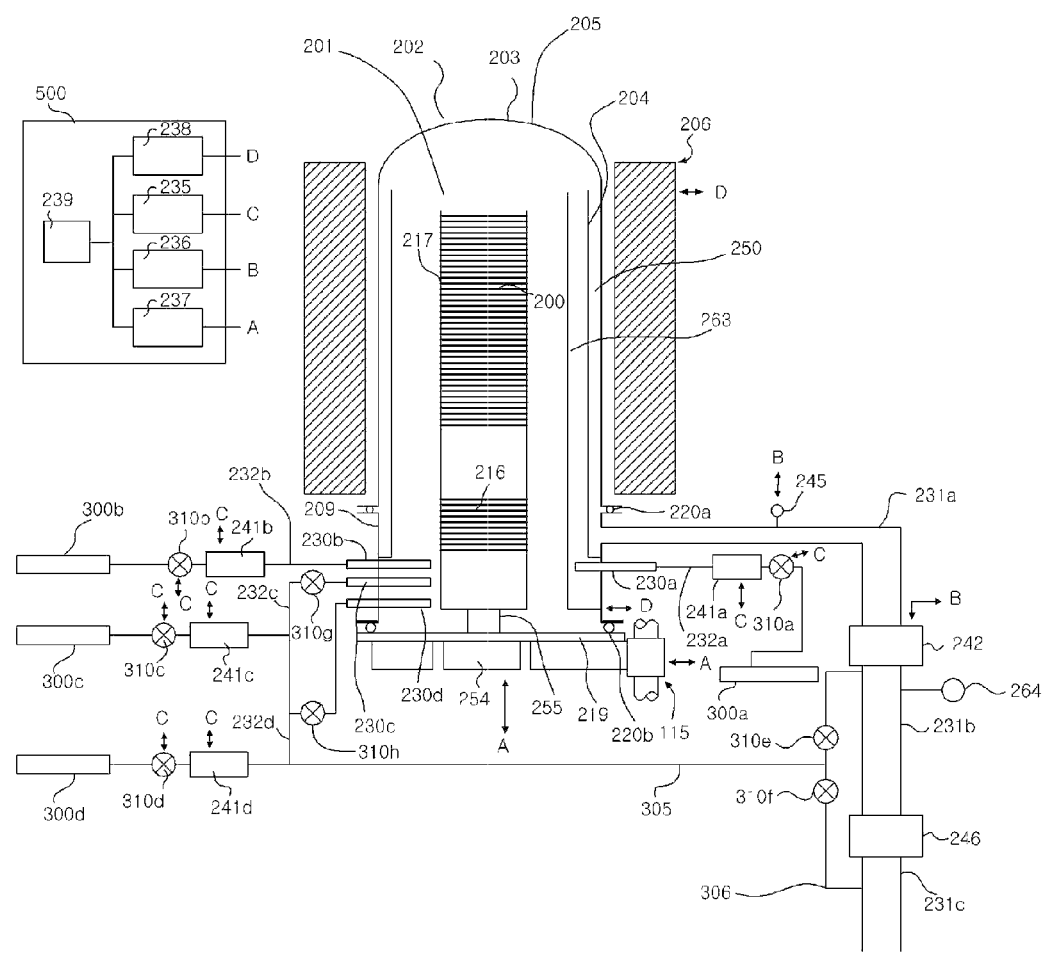
FIG. 2 is a side cross-sectional view illustrating a process furnace of a substrate processing apparatus according to an embodiment of the present invention, in which a configuration of controlling elements of the substrate processing apparatus is shown.

FIG. 2 is a side cross-sectional view schematically illustrating a configuration of a process furnace 202 of a substrate processing apparatus according to an embodiment of the present invention.

As illustrated in FIG. 2, the process furnace 202 includes a heater 206 which is a heating mechanism. The heater 206 has a barrel shape, e.g., a cylindrical shape, and is installed vertically while being supported by a heater base (not shown) as a retaining plate.

Inside the heater 206, a process tube 203 is installed concentrically with the heater 206 as a reaction tube. The process tube 203 includes an inner tube 204 which is an inner reaction tube, and an outer tube 205 which is an outer reaction tube installed at an outer side of the process tube 203. The inner tube 204 is formed of, for example, a heat-resistant material, e.g., quartz ($SiO_2$) or silicon carbide (SiC), and has a cylindrical shape, the upper and lower ends of which are open. A process chamber 201 is formed in a hollow tubular portion of the inner tube 204, and is configured such that the wafers 200 which are substrates are accommodated in a horizontal posture to be arranged in multiple stages in a vertical direction by a boat 217 which will be described below. The outer tube 205 is formed of, for example, a heat-resistant material, e.g., quartz ($SiO_2$) or silicon carbide (SiC), has a cylindrical shape, the internal diameter of which is greater than an external diameter of the inner tube 204, the upper end of which is closed, and the lower end of which is open, and is installed concentrically with the inner tube 204.

Below the outer tube 205, a manifold 209 is installed concentrically with the outer tube 205. The manifold 209 is formed of, for example, stainless steel and has a cylindrical shape, the upper and lower ends of which are open. The manifold 209 is engaged with the inner tube 204 and the outer tube 205 to support the inner tube 204 and the outer tube 205. An O-ring 220a which is a seal member is installed between the manifold 209 and the outer tube 205. Since the manifold 209 is supported by the heater base (not shown), the process tube 203 is vertically installed. A reaction chamber is formed by the process tube 203 and the manifold 209.

Nozzles 230a, 230b, and 230c serving as gas introduction ports are connected to the manifold 209 so that these nozzles may be communicated with the inside of the process chamber 201. In addition, the nozzles 230a, 230b, and 230c are connected to gas supply pipes 232a, 232b, and 232c, respectively. A silicon-containing gas source 300a, a chlorine-containing gas source 300b, and an inert gas source 300c are connected to the gas supply pipes 232a, 232b, and 232c at upstream sides opposite to sides of the gas supply pipes 232a, 232b, and 232c connected to the nozzles 230a, 230b, and 230c, via mass flow controllers (MFCs) 241a, 241b, and 241c which are gas flow rate control devices and valves 310a, 310b, and 310c which are switch devices. The MFCs 241a, 241b, and 241c are electrically connected to a gas flow rate control unit 235 so that a flow rate of supplied gas may be controlled at a predetermined timing to be equal to a predetermined level.

Gas supply units of the substrate processing apparatus configured to form a silicon film will now be described. A first gas supply unit that supplies a first process gas containing a silicon element into the process chamber 201 is installed. The first process gas containing a silicon element may be, for example, disilane ($Si_2H_6$) gas. The first gas supply unit mainly includes the silicon-containing gas source 300a, the valve 310a, the MFC 241a, the gas supply pipe 232a, and the nozzle 230a. The nozzle 230a is formed of, for example, quartz and is installed in the manifold 209 to pass through the manifold 209. At least one nozzle 230a is installed in a region facing the manifold 209 below a region facing the heater 206, and supplies a silicon-containing gas into the process chamber 201. The nozzle 230a is connected to the gas supply pipe 232a. The gas supply pipe 232a is connected to the silicon-containing gas source 300a that supplies, for example, disilane ($Si_2H_6$) gas as a silicon-containing gas via the MFC controller 241a which is a flow rate control device (flow rate control unit) and the valve 310a. Thus, a supply flow rate, concentration, and partial pressure of the first process gas supplied into the process chamber 201, e.g., disilane ($Si_2H_6$) gas, may be controlled.

A second gas supply unit that supplies a second process gas containing a silicon element and a chlorine element into the process chamber 201 is installed. The second process gas may be, for example, dichlorosilane ($SiH_2Cl_2$) gas. The second gas supply unit mainly includes the chlorine-containing gas source 300b, the valve 310b, the MFC 241b, the gas supply pipe 232b, and the nozzle 230b. The nozzle 230b is formed of, for example, quartz and is installed in the manifold 209 to pass through the manifold 209. At least one nozzle 230b is installed in the region facing the manifold 209 below the region facing the heater 206, and supplies the second process gas into the process chamber 201. The nozzle 230b is connected to the gas supply pipe 232b. The gas supply pipe 232b is connected to the chlorine-containing gas source 300b that supplies an oxygen-containing gas, e.g., dichlorosilane ($SiH_2Cl_2$) gas, via the MFC 241b which is a flow rate control device (flow rate control unit) and the valve 310b. Thus, a supply flow rate, concentration, and partial pressure of the second process gas supplied into the process chamber 201, e.g., dichlorosilane ($SiH_2Cl_2$) gas, may be controlled.

A third gas supply unit that supplies an inert gas into the process chamber 201 is installed. The inert gas may be, for example, nitrogen ($N_2$) gas. The third gas supply unit mainly includes the inert gas source 300c, the valve 310c, the MFC 241c, the gas supply pipe 232c, and the nozzle 230c. The nozzle 230c is formed of, for example, quartz and is installed in the manifold 209 to pass through the manifold 209. At least one nozzle 230c is installed in the region facing the manifold 209 below the region facing the heater 206, and supplies the inert gas into the process chamber 201. The nozzle 230c is connected to the gas supply pipe 232c. The gas supply pipe 232c is connected to the inert gas source 300c that supplies the inert gas, e.g., nitrogen (N2) gas, via the MFC 241c which is a flow rate control device (flow rate control unit) and the valve 310c. Thus, a supply flow rate, concentration, and partial pressure of the inert gas supplied into the process chamber 201, e.g., nitrogen (N2) gas, may be controlled.

A cleaning gas supply unit that supplies a cleaning gas into the process chamber 201 is installed. The cleaning gas supply unit mainly includes a cleaning gas source 300d, a valve 310d, an MFC 241d, a gas supply pipe 232d, and a nozzle 230d. The nozzle 230d that supplies, for example, nitrogen trifluoride (NF3) gas is formed of, for example, quartz, and is installed in the manifold 209 to pass through the manifold 209. At least one nozzle 230d is installed in the region facing the manifold 209 below the region facing the heater 206, and supplies the cleaning gas into the process chamber 201. The nozzle 230d is connected to the gas supply pipe 232d. The gas supply pipe 232d is connected to the cleaning gas source 300d via the MFC 241d which is a flow rate control device (flow rate control unit) and the valve 310d. Thus, a supply flow rate, concentration, and partial pressure of the cleaning gas supplied into the process chamber 201, e.g., nitrogen trifluoride (NF3) gas, may be controlled.

In addition, a cleaning gas bypass supply unit that supplies the cleaning gas into an exhaust pipe 231b at a rear end of a pressure adjustor 242 (which may also be referred to as a pressure adjusting unit) or into an exhaust pipe 231c at a rear end of a vacuum exhaust apparatus 246 is installed. The cleaning gas bypass supply unit mainly includes the cleaning gas source 300d, the valve 310d, the WC 241d, a first gas bypass supply pipe 305, a second gas bypass supply pipe 306, a valve 310e, and a valve 310f The first gas bypass supply pipe 305 is connected to the rear end of the pressure adjustor 242, and the second gas bypass supply pipe 306 is connected to the vacuum exhaust apparatus 246.

The valves 310a, 310b, 310c, 310d, 310e, 310f, 310g, and 310h and the MFCs 241a, 241b, 241c, and 241d are electrically connected to the gas flow rate control unit 235 so that a predetermined gas supply rate, start of gas supply, and end of gas supply may be controlled at predetermined timings.

Although in the present embodiment, the nozzles 230a, 230b, 230c, and 230d are installed in the region facing the manifold 209, the present invention is not limited thereto. For example, at least some of the nozzles 230a, 230b, 230c, and 230d may be installed in the region facing the heater 206, and a silicon-containing gas, a chlorine-containing gas, an inert gas, or an etching gas may be supplied from a wafer processing region. For example, the silicon-containing gas, the chlorine-containing gas, the inert gas, or the etching gas may be supplied near the wafers 200 at at least one location by extending a gas supply location to the wafer processing region using at least one L-shaped nozzle. In addition, the at least one L-shaped nozzle may be installed in the region facing the manifold 209 or the region facing the heater 206.

Although in the present embodiment, disilane (Si2H6) gas is used as the first process gas, the present invention is not limited thereto and silane (SiH4) gas, a higher-order silane gas, such as trisilane (Si3H8) gas, or a combination of silane (SiH4) gas and trisilane (Si3H8) gas may be used.

In addition, although in the present embodiment, dichlorosilane (SiH2Cl2) gas is used as the second process gas, the present invention is not limited thereto and silane chloride-based gas, e.g., trichlorosilane (SiHCl3) gas or tetrachlorosilane (SiCl4) gas, or a combination of chlorine (Cl2) gas and hydrogen chloride (HCl) gas may be used.

In addition, although in the present embodiment, nitrogen (N2) gas is used as the inert gas, the present invention is not limited thereto and a rare gas, e.g., helium (He) gas, neon (Ne) gas, or argon (Ar) gas, or a combination of nitrogen (N2) gas and such a rare gas may be used.

In addition, although in the present embodiment, nitrogen trifluoride (NF3) gas is used as the cleaning gas, the present invention is not limited thereto, and for example, chlorine trifluoride (ClF3) gas, fluorine (F2) gas, or a combination thereof may be used. In addition, the cleaning gas may be supplied together with an inert gas, e.g., nitrogen gas, as a diluent gas.

In the manifold 209, a first exhaust pipe 231a, a second exhaust pipe 231b, and a third exhaust pipe 231c are installed to exhaust atmosphere in the process chamber 201. The exhaust pipes 231a, 231b, and 231c are disposed at a lower end of a barrel-shaped space 250 formed by a space between the inner tube 204 and the outer tube 205, and are communicated with the barrel-shaped space 250. The vacuum exhaust apparatus 246, such as a vacuum pump, is connected to the exhaust pipes 231a, 231b, and 231c at downstream sides opposite to sides of the exhaust pipes 231a, 231b, and 231c connected to the manifold 209 via a pressure sensor 245 which is a pressure detector and a pressure adjustor 242, in order to vacuum-exhaust the process chamber 201 so that pressure in the process chamber 201 may be equal to a predetermined pressure (degree of vacuum). The exhaust pipes 231a, 231b, and 231c include the first exhaust pipe 231a connected to at least the process chamber 201, the second exhaust pipe 231b installed at the rear end of the pressure adjustor (pressure adjusting unit) 242, and the third exhaust pipe 231c installed at the rear end of the vacuum exhaust apparatus 246. Additional exhaust pipes may be further installed according to the shape of the process furnace 202. A pressure control unit 236 is electrically connected to the pressure adjustor 242 and the pressure sensor 245. The pressure control unit 236 is configured to control the pressure adjustor 242 to adjust the pressure in the process chamber 201 to be equal to a predetermined pressure at a predetermined timing, based on pressure detected by the pressure sensor 245.

Below the manifold 209, a seal cap 219 is installed as a furnace port lid that air-tightly closes the lower end opening of the manifold 209. The seal cap 219 is configured to vertically abut the lower end opening of the manifold 209. The seal cap 219 is formed of, for example, a metal, such as stainless steel, and has a disc shape. An O-ring 220b serving as a seal member abutting the lower end of the manifold 209 is installed on an upper surface of the seal cap 219. A rotation mechanism 254 that rotates the boat 217 is installed at a side of the seal cap 219 opposite to the process chamber 201. A rotation shaft 255 of the rotation mechanism 254 is connected to the boat 217, which will be described in detail below, while passing through the seal cap 219, and rotates the wafers 200 by rotating the boat 217. The seal cap 219 is configured to be vertically moved upward or downward by a boat elevator 115 which is a lifting mechanism vertically installed outside the process tube 203, thereby loading the boat 217 into or unloading the boat 217 from the process chamber 201. The rotation mechanism 254 and the boat elevator 115 are electrically connected to a driving control unit 237 and are configured to perform predetermined operations at predetermined timings, respectively.

The boat 217 serving as a substrate retainer is formed of a heat-resistant material, e.g., quartz or silicon carbide, and is configured to retain a plurality of the wafers 200 in multiple stages in a state in which the plurality of the wafers 200 are concentrically arranged in a horizontal posture. In a lower portion of the boat 217, a plurality of insulating plates 216 serving as insulating members that are each formed of a heat-resistant material, e.g., quartz or silicon carbide, and that each have a disc shape are arranged in a horizontal posture and in multiple stages to prevent heat generated from the heater 206 from being transferred to the manifold 209.

In the process tube 203, a temperature sensor 263 serving as a temperature detector is installed. A temperature control unit 238 is electrically connected to the heater 206 and the temperature sensor 263. The temperature sensor 263 is configured to control an amount of current to be supplied to the heater 206 at a predetermined timing, based on temperature information detected by the temperature sensor 263, so that the temperature in the process chamber 201 may have a predetermined temperature distribution.

The gas flow rate control unit 235, the pressure control unit 236, the driving control unit 237, and the temperature control unit 238 form an input/output (I/O) unit together, and are electrically connected to a main control unit 239 that controls overall operations of the substrate processing apparatus. The gas flow rate control unit 235, the pressure control unit 236, the driving control unit 237, the temperature control unit 238, and the main control unit 239 are configured together as a controller 500. In the main control unit 239, an input device 501 via which a user may manipulate the substrate processing apparatus and an output device 502 are installed.

Control Unit

Figure 3:
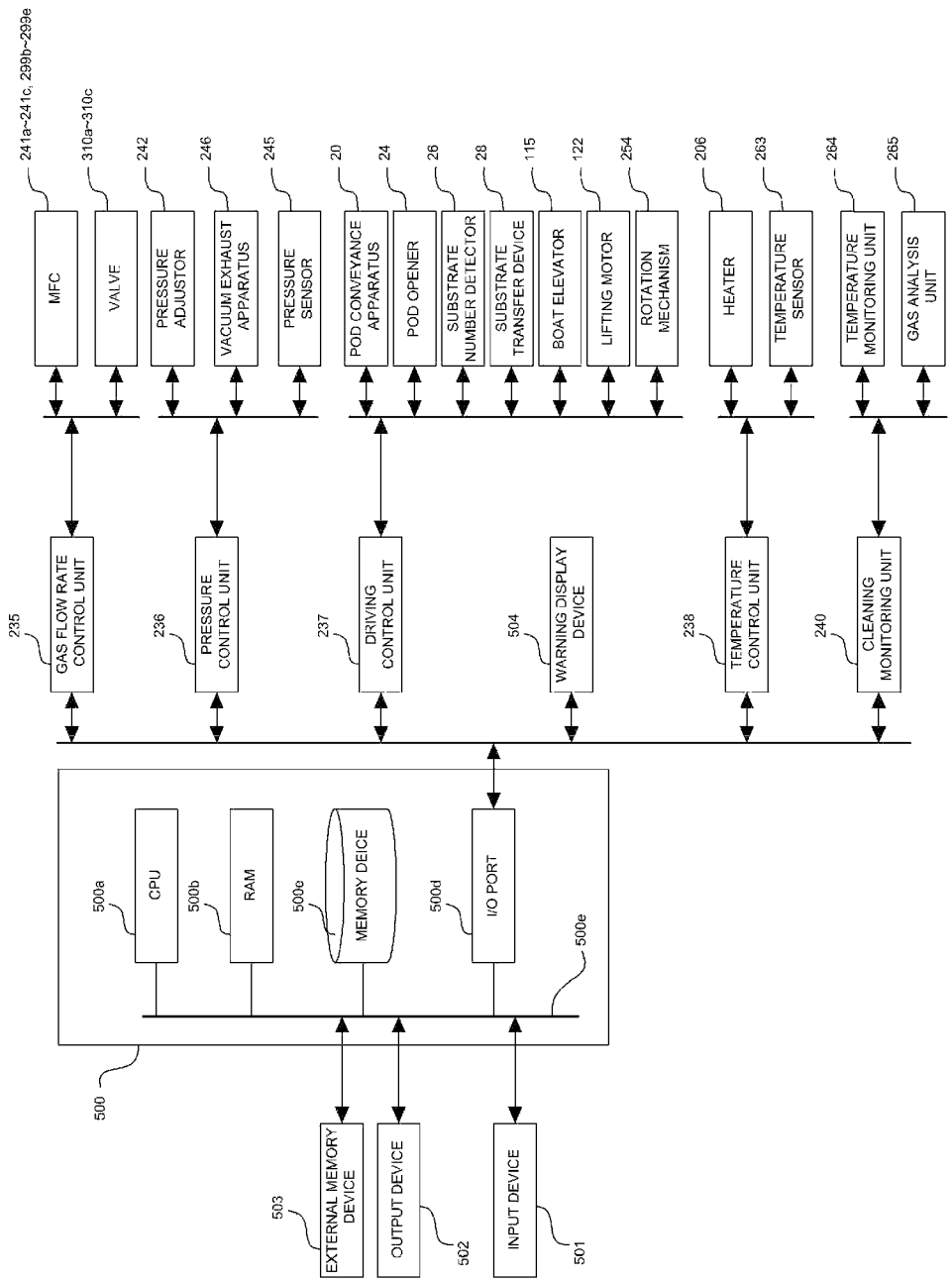
FIG. 3 is a schematic configuration diagram of a controller according to an embodiment of the present invention.

As illustrated in FIG. 3, the controller 500 including the main control unit 239 (main control means) is configured as a computer including a central processing unit (CPU) 500a, a random access memory (RAM) 500b, a memory device 500c, and an I/O port 500d. The RAM 500b, the memory device 500c, and the I/O port 500d are configured to exchange data with the CPU 500a via an internal bus 500e. The controller 500 is connected to a touch panel including the input device 501 and the output device 502, and the like.

The memory device 500c includes, for example, at least one of a flash memory and a hard disk drive (HDD). In the memory device 500c, a control program controlling an operation of the semiconductor manufacturing apparatus 10 or a process recipe instructing an order or conditions of processing a substrate which will be described below are stored to be readable. The process recipe is a combination of operations included in a substrate processing process, which will be described below, designed to obtain a desired result when the operations of the substrate processing process are performed by the controller 500, and functions as a program. Hereinafter, such a process recipe and a control program will be referred to collectively simply as a 'program.' In addition, when the term 'program' is used in the present disclosure, it may be understood as including only the process recipe, only the control program, or both the process recipe and the control program. The RAM 500b is configured as a work area for temporarily storing a program or data read by the CPU 500a.

The I/O port 500d is connected to the gas flow rate control unit 235, the pressure control unit 236, the driving control unit 237, the temperature control unit 238, a cleaning monitoring unit 240, and a warning display unit 504.

The CPU 500a is configured to read and execute the control program stored in the memory device 500c, and read the process recipe from the memory device 500c according to a manipulation command received via the I/O device 501. In addition, according to the read process recipe, the CPU 500a is configured to control the gas flow rate control unit 235 to adjust a flow rate of a process gas, control the pressure control unit 236 to adjust pressure, control the driving control unit 237 to transfer a substrate, control the temperature control unit 238 to adjust a temperature of each of the elements of the substrate processing apparatus, control the cleaning monitoring unit 240 to monitor a cleaning process, and control the warning display unit 504 to perform a warning display operation.

The controller 500 is not limited to a dedicated computer and may be configured as a general-purpose computer. For example, the controller 500 according to the present embodiment may be configured by preparing an external memory device 503 storing such programs, e.g., a magnetic disk (a magnetic tape, a flexible disk, a hard disk, etc.), an optical disc (a Compact Disc (CD), a Digital Versatile Disc (DVD), etc.), a magneto-optical disc (MO), or a semiconductor memory (a Universal Serial Bus (USB) memory, a memory card, etc.), and then installing the programs in a general-purpose computer using the external storage device 503. In addition, a method of supplying a program to a computer is not limited to using the external memory device 503. For example, a communication unit, e.g., the Internet or an exclusive line, may be used to supply a program to a computer without using the external memory device 503. The memory device 500c or the external memory device 503 may be configured as a non-transitory computer-readable recording medium. Hereinafter, the storage device 500c and the external storage device 503 may also be referred to collectively as simply a 'recording medium.' In addition, when the term 'recording medium' is used in the present disclosure, it may be understood as including only the memory device 500c, only the external memory device 503, or both the memory device 500c and the external memory device 503.

Although a case in which the warning display unit 504 is installed in the I/O port 500d has been described above, the present invention is not limited thereto and the warning display unit 504 may be installed in the cleaning monitoring unit 240.

(2) Substrate Processing Process

Figure 4:
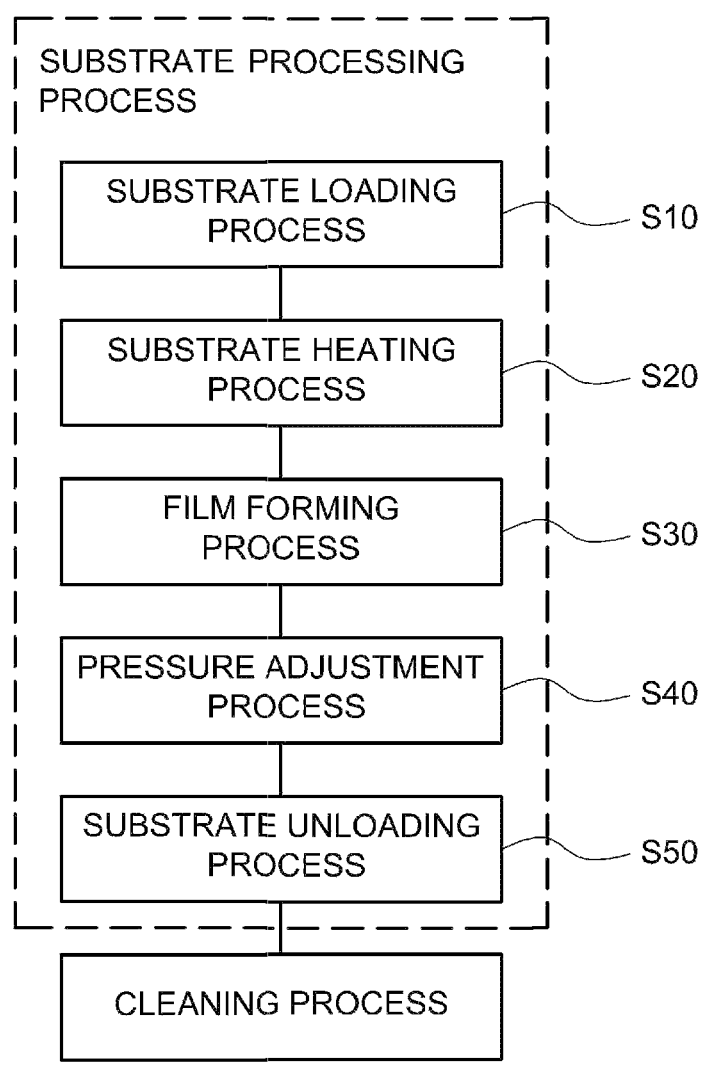
FIG. 4 is a flowchart illustrating a substrate processing process according to an embodiment of the present invention.

Next, a substrate processing process performed as a process of a semiconductor manufacturing process according to the present embodiment will be described with reference to FIG. 4. The substrate processing process is performed by the substrate processing apparatus described above. In the following description, operations of elements of the substrate processing apparatus are controlled by the controller 500.

Here, a process of forming a silicon film that forms a semiconductor device will be described.

Substrate Loading Process S10

When a plurality of wafers 200 are loaded into the boat 217 (wafer charging), the boat 217 retaining the plurality of wafers 200 is lifted by the boat elevator 115 and is then loaded into the process chamber 201 (boat loading) as illustrated in FIG. 2. In this state, the lower end of the manifold 209 is air-tightly closed by the seal cap 219 via the O-ring 220.

Substrate Heating Process S20

The inside of the process chamber 201 is vacuum-exhausted by the vacuum exhaust device 246 to have a predetermined pressure (degree of vacuum). In this case, the pressure in the process chamber 201 is measured by the pressure sensor 245 and is feedback-controlled by the pressure adjustor 242, based on the measured pressure. In addition, the inside of the process chamber 201 is heated to a predetermined temperature by the heater 206. In this case, an amount of current supplied to the heater 206 is feedback-controlled based on temperature information detected by the temperature sensor 263, so that the inside of the process chamber 201 may have a predetermined temperature distribution. Then, the plurality of wafers 200 are rotated by rotating the boat 217 by the rotating mechanism 254.

Film Formation Process S30

Then, as illustrated in FIG. 2, a process gas, e.g., a first process gas, is supplied from the silicon-containing gas source 300a. The first process gas is controlled by the MFC 241a to have a predetermined flow rate, flows through the gas supply pipe 232a, and is then introduced into the process chamber 201 via the nozzle 230a. The introduced first process gas, e.g., a silicon-containing gas, flows upward within the process chamber 201, flows to the barrel-shaped space 250 via an upper opening of the inner tube 204, and is then exhausted via the exhaust pipes 231a, 231b, and 231c. In addition, a second process gas containing a silicon element and a chlorine element is supplied from the chlorine-containing gas source 300b. The second process gas is controlled by the MFC 241b to have a predetermined flow rate, flows through the gas supply pipe 232b, and is then introduced into the process chamber 201 via the nozzle 230b. The introduced second process gas flows upward within the process chamber 201, flows to the barrel-shaped space 250 via the upper opening of the inner tube 204, and is then exhausted via the exhaust pipes 231a, 231b, and 231c. When the silicon-containing gas and a chlorine element-containing gas pass the inside of the process chamber 201, these gases contact surfaces of the wafers 200 and a film, e.g., a silicon film, is thus deposited on the wafers 200 due to a thermal chemical vapor deposition (CVD) reaction. In addition, since the second process gas is used, a portion of the deposited silicon film is etched (removed). Since the silicon film is deposited on the wafers 200 while being etched, the silicon film having high surface smoothness may be formed.

In addition, for example, process conditions according to the present embodiment may include a process temperature ranging from 300° C. to 550° C., a process pressure ranging from 10 Pa to 1330 Pa, the flow rate of the first process gas ranging from 10 sccm to 2,000 sccm, and the flow rate of the second process gas ranging from 10 sccm to 500 sccm.

Pressure Adjustment Process S40

If a predetermined process time elapses, then an inert gas controlled by the MFC 241c to have a predetermined flow rate is supplied from the inert gas source 300c, the pressure adjustor 242 is blocked while substituting an atmosphere in the process chamber 201 with an inert gas, and pressure in the process chamber 201 is thus returned to normal pressure.

Substrate Unloading Process S50

Then, the seal cap 219 is moved downward by the boat elevator 115 to open the lower end of the manifold 209, and at the same time, the processed wafers 200 are unloaded from the process tube 203 via the lower end of the manifold 209 while being retained in the boat 217 (boat unloading). After the processed wafers 200 are unloaded, the boat 217 may stand by at a predetermined location until the boat 217 is cooled, if needed. Then, the processed wafers 200 are discharged by the boat 217 (wafer discharging), thereby completing the processes of the substrate processing process performed by the semiconductor manufacturing apparatus 10.

Although it is described above that CVD is used to form a film, the present invention is not limited thereto and plasma CVD, atomic layer epitaxy (ALE), or atomic layer deposition (ALD) may be used.

(3) Cleaning Process

Figure 5:
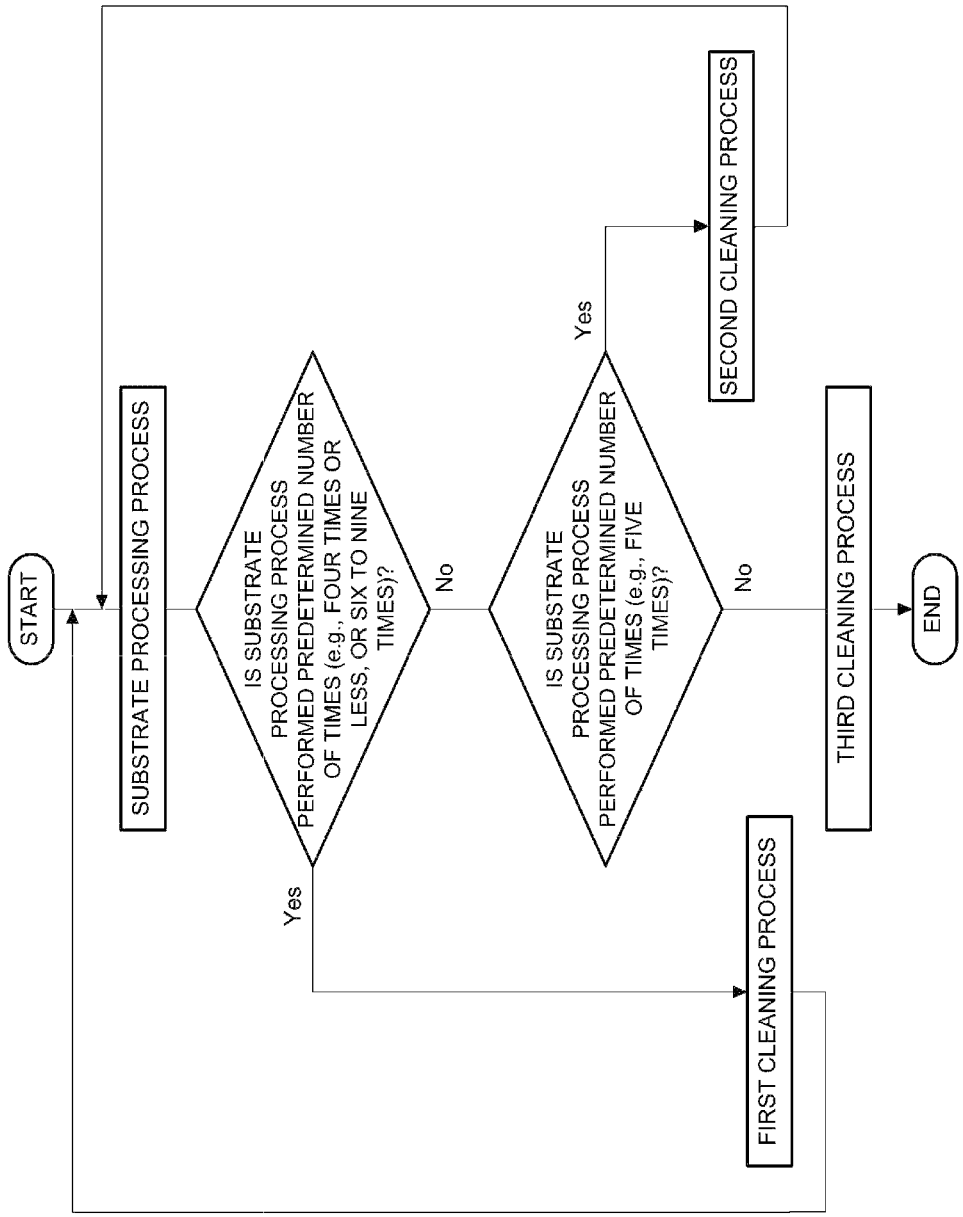
FIG. 5 is a flowchart illustrating a cleaning process according to an embodiment of the present invention.

Next, cleaning processes performed as a process of a semiconductor manufacturing process according to the present embodiment will be described with reference to FIG. 5. The cleaning processes are performed by the substrate processing apparatus described above. In addition, in the following description, the operations of the elements of the substrate processing apparatus are controlled by the controller 500. The inventor of the present application found the following problems. When a film was formed using the first process gas containing a silicon element and the second process gas containing a silicon element and a chlorine element as in the film formation process, a film deposited on a wafer 200 was formed while being etched and thus had high surface smoothness. Since the film was formed while being etched, an amount of gas used to form the film once was large. Thus, use of the first process gas and the second process gas caused a large amount of by-products or non-reactive components, such as $Si_xH_y$ or $Si_xH_yCl_z$, to be deposited on the exhaust pipes 231a, 231b, and 231c. In addition, since the large amount of the deposited by-products or non-reactive components changed into a gaseous state or a process gas or an inert gas was adsorbed onto/separated from surfaces of the deposited by-products or non-reactive components, an exhaust speed was not maintained constant. In addition, since the deposited by-products or non-reactive components were deposited within the vacuum exhaust apparatus, the lifetime of the vacuum exhaust apparatus was shortened, thereby causing the vacuum exhaust apparatus to be unexpectedly stopped. Due to the unexpected stopping of the vacuum exhaust apparatus, exchange of vacuum exhaust apparatuses, piping, vacuum valves, and pressure measurement devices was difficult to perform while the degree of vacuum or atmosphere in the process chamber 201 or the exhaust pipes 231a, 231b, and 231c was maintained constant. Thus, the inventor has determined that the cleaning processes which will be described below are effective to solve these problems.

First Cleaning Process

A first cleaning process is performed after the substrate processing process described above is performed, e.g., four times or less or six to nine times. Mainly, the inside of the exhaust pipe 231b or the vacuum exhaust apparatus 246 is cleaned through the first cleaning process. After the pressure adjustment process described above is completed, a cleaning gas is supplied to the exhaust pipe 231b from the cleaning gas source 300d included in the cleaning gas bypass supply unit via the first gas bypass supply pipe 305. By supplying the cleaning gas, by-products and non-reactive components of a source gas adsorbed onto the exhaust pipe 231b located at the rear end of the pressure adjustor 242 are cleaned. Then, an inert gas is supplied from the inert gas source 300c into the exhaust pipe 231b, thereby purging an exhaust unit at the rear of the exhaust pipe 231b. The inside of the exhaust pipe 231b or the vacuum exhaust apparatus 246 is cleaned as described above. As described above, by performing the first cleaning process after the film formation process described above is completed, by-products or non-reactive components may be prevented from remaining in the exhaust pipe 231*b* or the vacuum exhaust apparatus 246 even when a film is formed using a large amount of a gas. Thus, an exhaust speed may be maintained constant. Furthermore, the lifetime of the vacuum exhaust apparatus 246 may be increased to prevent the vacuum exhaust apparatus 246 from being unexpectedly stopped, and the maintenance of the vacuum exhaust apparatus 246 may be easily performed while the atmosphere in the process chamber 201 or the exhaust pipes 231*a*, 231*b*, and 231*c* is maintained constant.

Second Cleaning Process

A second cleaning process is performed after the substrate processing process is performed a predetermined number of times. By-products or non-reactive components adsorbed onto the process tube 203, the inner tube 204, and the outer tube 205 that are main elements of the process chamber 201 are cleaned. After the substrate unloading process described above, the pressure adjustor 242 installed to the exhaust pipes 231*a*, 231*b*, and 231*c* is closed. Then, a cleaning gas is supplied into the process chamber 201 from the cleaning gas source 300*d* included in the cleaning gas supply unit. By supplying the cleaning gas, by-products or non-reactive components adsorbed onto at least the process tube 203, the inner tube 204, and the outer tube 205 are cleaned. As described above, since the second cleaning process is performed after the substrate processing process is performed the predetermined number of times, particles may be suppressed even when an amount of by-products or non-reactive components adsorbed onto the process chamber 201 is large, thereby enabling a silicon film having high surface smoothness to be formed on a substrate.

Third Cleaning Process

A third cleaning process is performed after the substrate processing process is performed a predetermined number of times. Thus, inner walls of the exhaust pipe 231*c* located at the rear end of the vacuum exhaust apparatus 246 or a scrubber (not shown) connected to the rear end of the vacuum exhaust apparatus 246 is cleaned. Pressure in the exhaust pipe 231*c* is higher than that in the exhaust pipe 231*b* at the rear end of the pressure adjustor 242. In other words, since a large amount of a gas used to form the film continuously remains, a large amount of by-products or non-reactive components is deposited. After the pressure adjustment process described above, a cleaning gas is supplied to the exhaust pipe 231*c* from the cleaning gas source 300*d* included in the cleaning gas bypass supply unit. By supplying the cleaning gas, the deposited by-products in the exhaust pipe 231*c* are removed. After a predetermined time elapses, the supply of the cleaning gas is suspended, and an inert gas is supplied from the inert gas source 300*c* to purge the cleaning gas. As described above, the manufacturing throughput of a semiconductor device may be improved by performing the third cleaning process after the substrate processing process is performed the predetermined number of times.

In addition, a process of supplying the cleaning gas into a reaction chamber and a process not performed via the reaction chamber may be performed sequentially or simultaneously if needed.

Each part of the substrate processing apparatus can be appropriately cleaned by performing gas cleaning in the exhaust system by performing gas cleaning within the reaction chamber as described above. In addition, films or non-reactive materials remaining in not only the reaction chamber but also the exhaust system may be effectively cleaned, thereby preventing the vacuum exhaust apparatus 246 from being unexpectedly stopped.

As an example, during the cleaning processes according to the current embodiment, the flow rate of the cleaning gas ranges from 10 sccm to 5,000 sccm.

In addition, conditions of cleaning the inside of the reaction chamber may be preferably set to be different from conditions of cleaning the exhaust unit. Thus, for example, damage to quartz used to form the reaction chamber, caused by use of the cleaning gas, may be minimized, and the lifetime of the quartz may be increased.

In addition, the supply rate of the cleaning gas may be preferably gradually increased together with a process of cleaning the reaction chamber and a process of cleaning the exhaust unit. Accordingly, the risk of abnormal reactions may be reduced, and damage to the elements of the substrate processing apparatus, caused by the cleaning processes may be minimized.

Furthermore, the performances of the elements of the substrate processing apparatus may be maintained constant by performing a cleaning process through a combination of the first cleaning process, the second cleaning process, and the third cleaning process, the manufacturing throughput of the semiconductor device may be improved, and the maintenance of the semiconductor device may be easily performed.

(4) Effects of the Present Embodiment

According to the present embodiment, at least one of the following effects which will be described below can be achieved.

(a) According to the current embodiment, an exhaust system in the reaction chamber may be appropriately cleaned.

(b) A cleaned state of the exhaust system may be monitored.

(c) A vacuum exhaust apparatus may be prevented from being unexpectedly stopped.

(d) Damage to elements of a substrate processing apparatus by a cleaning gas may be reduced.

(e) The lifespans of the elements of the substrate processing apparatus may be increased.

(f) An amount of residual materials may be minimized, thereby suppressing generation of foreign substances (particles).

(g) A semiconductor device having improved performance may be stably manufactured, thereby improving the throughput.

Second Embodiment

A second embodiment of the present invention will now be described. The second embodiment is a modified example of the first embodiment.

In the second embodiment, cleaning is performed while monitoring the state of the cleaning by installing the cleaning monitoring unit 240 in a portion of the exhaust unit.

Figure 6:
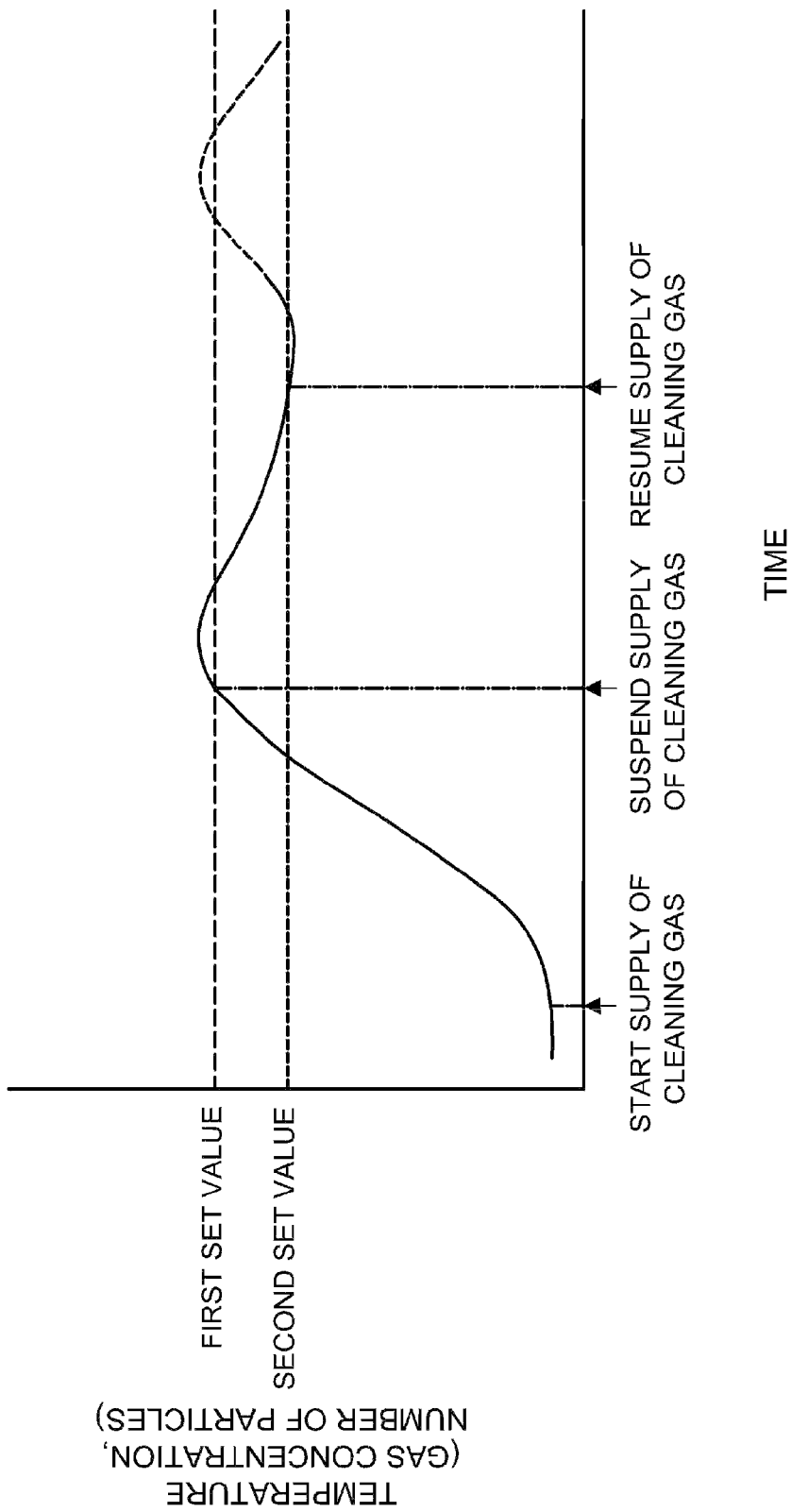
FIG. 6 is a graph illustrating a relationship between a timing of supplying a cleaning gas and a temperature of an exhaust piping according to an embodiment of the present invention.

In the second embodiment, a temperature monitoring unit 264 is installed as the cleaning monitoring unit 240 in an exhaust piping to control cleaning by monitoring a temperature of the exhaust piping. For example, as illustrated in FIG. 2, a step of measuring a temperature is performed by installing the temperature monitoring unit 264 in the exhaust pipe 231*b* to measure a temperature of a portion of the exhaust piping (the exhaust pipe 231*b*), and measured temperature data is transmitted to the main control unit 239. As illustrated in FIG. 6, the main control unit 239 performs a step of determining whether the temperature increases to a predetermined temperature (first set value), and transmits a signal indicating that the supply of the cleaning gas should be suspended once to the gas flow rate control unit 235 when the temperature is equal to or greater than the first set value. The temperature is measured while the supply of the cleaning gas is suspended to determine whether the temperature is lowered to a predetermined temperature (second set value). When the temperature is lowered to a temperature at which cleaning may begin (second set value) (preferably, when it is checked that the temperature is stabilized), the supply of the cleaning gas is resumed. Cleaning is performed by repeatedly performing this cycle a plurality of times.

Thus, the portion of the exhaust system may be suppressed from being abnormally heated by the cleaning gas and reactive heat generated by abnormal reaction of by-products and a non-reactive material. By suppressing the portion of the exhaust system from being abnormally heated by the abnormal reaction, a seal member, e.g. an O-ring, which forms the exhaust system or an inner wall of a piping may be suppressed from deteriorating and damage to the exhaust system, caused by the deterioration of the seal member or the inner wall of the piping may be suppressed.

In addition, a gas analysis unit 265 may be installed as the cleaning monitoring unit 240 in the exhaust piping. An example of the gas analysis unit 265 may be an analyzing apparatus employing infrared spectroscopy, e.g., FTIR or NDIR. A concentration of a predetermined gas (amount of SiFx) generated during a cleaning process is measured, supply of a cleaning gas is suspended once when the concentration of the predetermined gas increases to a predetermined level, and a step preceding the cleaning process, e.g., a step of stabilizing the amount of SiFx, is performed. When the amount of SiFx is lowered to a level at which the cleaning process may begin using the step of stabilizing the amount of SiFx (preferably, when it is checked that the amount of SiFx is stabilized), the supply of the cleaning gas is resumed. The cleaning process is performed by repeatedly performing this cycle a plurality of times.

In addition, a particle counter may be installed as the cleaning monitoring unit 240 in the exhaust piping. An amount of particles generated during the cleaning process is measured, the supply of the cleaning gas is suspended once when the amount of particles increases to a predetermined level (first set value), the amount of particles is lowered to a predetermined level (second set value), and then the supply of the cleaning gas is resumed. The cleaning process is performed by repeatedly performing this cycle a plurality of times.

In addition, when a first value is detected from a signal received from the cleaning monitoring unit 240, the main control unit 239 transmits a lock signal to lock the input device 501 so that the substrate processing apparatus cannot perform any work until a second value is detected. By locking the input device 501, the elements of the substrate processing apparatus may be prevented from being deteriorated due to an unnecessary manipulation. In addition, opening/closing of the housing 12 may be locked. In addition, a warning message may be displayed on the output device 502 and the warning display unit 504. By displaying the warning message, a user may be informed of the state of the substrate processing apparatus.

According to the present embodiment, it is possible to achieve not only the effects of the first embodiment but also at least one of the following effects: (a) the exhaust system may be prevented from being abnormally heated during the cleaning processes; and (b) the exhaust system may be suppressed from being deteriorated due to a cleaning gas.

A substrate processing apparatus and method according to an embodiment of the present invention are capable of suppressing degradation of the quality of a substrate or the performance of a semiconductor device.

Furthermore, the present invention is not limited to batch-type vertical devices and may be applied to single-wafer type apparatuses capable of processing one substrate at a time.

In addition, although the present invention has been described with reference to forming a polysilicon film, the present invention may also be applied to forming other films, e.g., an epitaxial film, a CVD film, such as a silicon nitride film, and so on.

Exemplary Embodiments of the Present Invention

Hereinafter, exemplary aspects of the present invention will be supplementarily noted.

Supplementary Note 1

According to an embodiment of the present invention, there is provided a substrate processing apparatus including: a reaction chamber configured to accommodate a substrate; a first gas supply unit configured to supply a first process gas containing a silicon element to the substrate; a second gas supply unit configured to supply a second process gas containing a silicon element and a chlorine element to the substrate; an exhaust unit configured to exhaust the first process gas and the second process gas; a cleaning gas bypass supply unit configured to supply a cleaning gas to the exhaust unit; a cleaning monitoring unit installed in the exhaust unit; a gas flow rate control unit configured to adjust an amount of the cleaning gas supplied; and a main control unit configured to control the gas flow rate control unit in response to a signal received from the cleaning gas monitoring unit.

Supplementary Note 2

In the substrate processing apparatus of Supplementary Note 1, the cleaning monitoring unit may include a temperature monitoring unit configured to measure a temperature of the exhaust unit.

Supplementary Note 3

In the substrate processing apparatus of Supplementary Note 1, the cleaning monitoring unit may include a by-product monitoring unit configured to measure an amount of by-products in the exhaust unit.

Supplementary Note 4

In the substrate processing apparatus of Supplementary Note 2, the temperature monitoring unit may measure a temperature of an exhaust piping of the exhaust unit.

Supplementary Note 5

In the substrate processing apparatus of one of Supplementary Notes 1 to 4, the main control unit may control the gas flow rate control unit and a valve control device of the exhaust unit to close a main valve of the exhaust unit and supply the cleaning gas via the cleaning gas bypass supply unit whenever the substrate processing apparatus completes a film formation.

Supplementary Note 6

In the substrate processing apparatus of one of Supplementary Notes 1 to 5, the main control unit may control the cleaning gas bypass supply unit, the exhaust unit, and the gas flow rate control unit to supply the cleaning gas into the reaction chamber and the exhaust piping after the substrate processing apparatus performs a film formation process a predetermined number of times.

Supplementary Note 7

In the substrate processing apparatus of one of Supplementary Notes 1 to 6, the main control unit may suspend the supply of the cleaning gas when a predetermined value is detected from the signal received from the cleaning monitoring unit.

Supplementary Note 8

In the substrate processing apparatus of one of Supplementary Notes 1 to 7, the main control unit may lock a predetermined unit when an arbitrary value is detected from the signal received from the cleaning monitoring unit.

Supplementary Note 9

In the substrate processing apparatus of Supplementary Note 7 or 8, the predetermined value may be a temperature that deteriorates a seal member installed in the exhaust unit.

Supplementary Note 10

In the substrate processing apparatus of Supplementary Note 8, the predetermined unit is a door configured to open and close a housing of the substrate processing apparatus.

Supplementary Note 11

In the substrate processing apparatus of Supplementary Note 7 or 8, the main control unit may display a warning message on at least one of a manipulation unit and a warning unit of the substrate processing apparatus when a predetermined value is detected from the signal received from the cleaning monitoring unit.

Supplementary Note 12

According to another embodiment of the present invention, there is provided a method of manufacturing a semiconductor device, the method including: a film formation process including supplying a first process gas containing a silicon element to a substrate and supplying a second process gas containing a silicon element and a chlorine element to the substrate; and a cleaning process including supplying a cleaning gas to an exhaust unit via a cleaning gas bypass line, monitoring the exhaust unit, and controlling a flow rate of the cleaning gas in response to a signal received from a cleaning monitoring unit.

Supplementary Note 13

In the method of Supplementary Note 12, the monitoring of the exhaust unit may include measuring a temperature in the exhaust unit using the cleaning monitoring unit.

Supplementary Note 14

In the method of Supplementary Note 12, the monitoring of the exhaust unit may include measuring an amount of by-products in the exhaust unit using the cleaning monitoring unit.

Supplementary Note 15

In the method of Supplementary Note 12, the monitoring of the exhaust unit may include measuring a temperature in the exhaust piping using the cleaning monitoring unit.

Supplementary Note 16

In the method of one of Supplementary Notes 12 to 15, the cleaning process may include: a first cleaning process of cleaning a rear end of a main valve of the exhaust unit whenever the film formation process is performed; and a second cleaning process of cleaning a reaction chamber and the exhaust unit whenever the film formation process is performed a predetermined number of times.

Supplementary Note 17

The method of one of Supplementary Notes 12 to 16 may further include suspending the supplying of the cleaning gas when a predetermined value is detected from the signal received from the cleaning monitoring unit.

Supplementary Note 18

The method of one of Supplementary Notes 12 to 17 may further include locking a predetermined unit when a predetermined value is detected from the signal received from the cleaning monitoring unit.

Supplementary Note 19

In the method of Supplementary Note 17 or 18, the predetermined value may be a temperature that deteriorates a seal member installed in the exhaust unit.

Supplementary Note 20

In the method of Supplementary Note 18, the predetermined unit may include at least one of a door configured to open and close a housing of the substrate processing apparatus and an input device.

Supplementary Note 21

The method of Supplementary Note 18 or 19 may further include displaying a warning message on at least one of an output device and a warning display unit when a predetermined value is detected from the signal received from the cleaning monitoring unit.

Supplementary Note 22

According to still another embodiment of the present invention, there is provided a program that causes a computer to perform: a film formation sequence including supplying a first process gas containing a silicon element to a substrate and supplying a second process gas containing a silicon element and a chlorine element to the substrate; and a cleaning sequence including supplying a cleaning gas to an exhaust unit via a cleaning gas bypass line, monitoring the exhaust unit, and controlling a flow rate of the cleaning gas in response to a signal received from a cleaning monitoring unit.

Supplementary Note 23

In the program of Supplementary Note 22, the monitoring of the exhaust unit may include measuring a temperature in the exhaust unit using the cleaning monitoring unit.

Supplementary Note 24

In the program of Supplementary Note 22, the cleaning monitoring unit may measure a temperature in the exhaust unit.

Supplementary Note 25

In the program of Supplementary Note 22, the monitoring of the exhaust unit may include measuring an amount of by-products in the exhaust unit using the cleaning monitoring unit.

Supplementary Note 26

In the program of one of Supplementary Notes 22 to 25, the cleaning sequence may include: a first cleaning sequence of cleaning a rear end of a main valve of the exhaust unit whenever the film formation sequence is performed; and a second cleaning sequence of cleaning a reaction chamber and the exhaust unit whenever the film formation sequence is performed a predetermined number of times.

Supplementary Note 27

The program of one of Supplementary Notes 22 to 26 may further include suspending the supplying of the cleaning gas when a predetermined value is detected from the signal received from the cleaning monitoring unit.

Supplementary Note 28

The program of one of Supplementary Notes 22 to 27 may further include locking a predetermined unit when a predetermined value is detected from the signal received from the cleaning monitoring unit.

Supplementary Note 29

In the program of Supplementary Note 27 or 28, the predetermined value may be a temperature at which a seal member installed in the exhaust unit deteriorates.

Supplementary Note 30

In the program of Supplementary Note 28, the predetermined unit may include at least one of a door configured to open and close a housing of the substrate processing apparatus and an input device.

Supplementary Note 31

The program of one of Supplementary Notes 22 to 27 may further include displaying a warning message on at least one of an output device and a warning display unit when a predetermined value is detected from the signal received from the cleaning monitoring unit.

Supplementary Note 32

According to yet another embodiment of the present invention, there is provided a non-transitory computer-readable recording medium storing a program that causes a computer to perform: a film formation sequence including supplying a first process gas containing a silicon element to a substrate and supplying a second process gas containing a silicon element and a chlorine element to the substrate; and a cleaning sequence including supplying a cleaning gas to an exhaust unit via a cleaning gas bypass line, monitoring the exhaust unit, and controlling a flow rate of the cleaning gas in response to a signal received from a cleaning monitoring unit.

What is claimed is:

1. A substrate processing apparatus comprising:
a reaction chamber where a substrate is accommodated and processed by supplying a process gas containing a silicon element;
an exhaust unit configured to exhaust the process gas;
a cleaning gas bypass supply unit configured to supply a cleaning gas directly to the exhaust unit without having the cleaning gas pass through the reaction chamber;
a temperature monitoring unit installed in the exhaust unit and configured to measure a temperature of the exhaust unit;
a gas analysis unit installed in the exhaust unit and configured to analyze a gas generated in the exhaust unit;
a gas flow rate control unit configured to adjust an amount of the cleaning gas supplied; and
a main control unit configured to: control the cleaning gas bypass supply unit to supply the cleaning gas directly to the exhaust unit without having the cleaning gas pass through the reaction chamber; control the gas flow rate control unit to adjust the amount of the cleaning gas supplied to the exhaust unit by the cleaning gas bypass supply unit in response to a signal received from the gas analysis unit; and monitor the exhaust unit.

2. The apparatus according to claim 1, wherein the main control unit is further configured to control the cleaning gas bypass supply unit, the exhaust unit and the gas flow rate control unit to supply the cleaning gas into the reaction chamber and an exhaust piping after the substrate processing apparatus performs a film formation process a predetermined number of times.

3. The apparatus according to claim 1, wherein the main control unit is further configured to control the gas flow rate control unit to suspend a supply of the cleaning gas when a predetermined value is detected from the signal received from the gas analysis unit.

4. The apparatus according to claim 1, wherein the main control unit is further configured to display a warning message on a warning display device of the substrate processing apparatus when a predetermined value is detected from the signal received from the gas analysis unit.

5. The substrate processing apparatus of claim 1, further comprising:
a pressure adjusting unit configured to adjust an inside pressure of the reaction chamber; and
an exhaust apparatus configured to exhaust an inside of the reaction chamber via the pressure adjusting unit,
wherein the main control unit is further configured to control the pressure adjusting unit and the exhaust apparatus to adjust the inside pressure and exhaust the inside of the reaction chamber while the cleaning gas is supplied by the cleaning gas bypass supply unit based on an analysis by the gas analysis unit.

6. The substrate processing apparatus of claim 5, further comprising: a first exhaust pipe connecting the reaction chamber and an upstream side of the pressure adjusting unit;
a second exhaust pipe connecting a downstream side of the pressure adjusting unit and an upstream side of the exhaust apparatus;
a third exhaust pipe connected to a downstream of the exhaust apparatus;
a first gas bypass supply pipe connected to the second exhaust pipe;
a first valve installed at the first gas bypass supply pipe and configured to suspend and resume a supply of the cleaning gas into the second exhaust pipe;
a second gas bypass supply pipe connected to the third exhaust pipe; and
a second valve installed at the second gas bypass supply pipe and configured to suspend and resume a supply of the cleaning gas into the third exhaust pipe,
wherein the main control unit is further configured to open the first valve with the second valve closed so as to clean the downstream side of the pressure adjusting unit while supplying the cleaning gas.

7. The substrate processing apparatus of claim 6, wherein the main control unit is further configured to close the first valve with the second valve open so as to clean the downstream side of the exhaust apparatus while supplying the cleaning gas.

8. The substrate processing apparatus of claim 6, further comprising a cleaning gas supply unit configured to supply the cleaning gas into the reaction chamber,
wherein the main control unit is further configured to control the cleaning gas supply unit and the cleaning gas bypass supply unit such that a flow rate of the cleaning gas supplied into the reaction chamber is lower than that of the cleaning gas supplied into at least one of the first gas bypass supply pipe and the second gas bypass supply pipe.

9. The substrate processing apparatus of claim 5, further comprising: a first gas supply unit configured to supply a first process gas containing a predetermined element to the substrate; and a second gas supply unit configured to supply a second process gas containing the predetermined element and a halogen element to the substrate,
wherein the main control unit is further configured to control the first gas supply unit, the second gas supply unit, the pressure adjusting unit and the exhaust apparatus so as to concurrently supply the first process gas and the second process gas to the substrate to form a film on the substrate while the substrate is etched.

10. The substrate processing apparatus of claim 1, wherein the main control unit is further configured to control the cleaning gas bypass supply unit to supply the cleaning gas to the exhaust unit with a main valve installed between the exhaust unit and the reaction chamber closed.

* * * * *